Aug. 7, 1951 W. G. PFANN 2,563,504

SEMICONDUCTOR TRANSLATING DEVICES

Filed Oct. 26, 1949

INVENTOR
W. G. PFANN
BY [signature]
ATTORNEY

Patented Aug. 7, 1951

2,563,504

UNITED STATES PATENT OFFICE 2,563,504

SEMICONDUCTOR TRANSLATING DEVICE

William G. Pfann, Chatham, N. J., assignor to Bell Telephone Laboratories, Incorporated, New York, N. Y., a corporation of New York Application October 26, 1949, Serial No. 123,760

8 Claims. (Cl. 175—366)

This invention relates to a semiconductor signal translating device and more particularly to semiconductor amplifiers of the general type disclosed in the application Serial No. 33,466, filed June 17, 1948, of J. A. Bardeen and W. H. Brattain, now Patent 2,524,035, granted October 3, 1950.

The devices of the type disclosed in the application above-identified comprise, in general, a body of semiconductive material such as germanium, a pair of rectifying connections, designated as the emitter and the collector, to the body and a third large area or substantially ohmic connection, referred to as the base, to the body. The emitter and collector may be in the form of point contacts and the base may be a metallic coating upon the body.

In operation of the devices, signals are impressed between the emitter and the base and amplified replicas of such signals are produced in a load circuit connected between the collector and the base.

Such devices may be represented by an equivalent four-terminal network of T configuration, the impedance in the leg of the T being common to the input and output circuits and constituting a path for positive feedback. In some applications, such feedback is markedly undesirable as it leads to instability, and, thus, places restrictions upon the conditions under which the device may be operated.

As disclosed in the application Serial No. 90,533, filed April 29, 1949, of R. L. Wallace, the positive feedback impedance is related to the position of the emitter relative to the base and low values of the feedback impedance can be obtained by placing the emitter closer to the base than is the collector, the emitter-to-base spacing being as small as is practicable.

One object of this invention is to reduce the positive feedback impedance in semiconductor translating devices of the type above described. Another object of this invention is to facilitate the attainment of extremely small emitter-to-base spacings.

In accordance with one feature of this invention, in a semiconductor translating device of the type above described, the emitter is in the form of a point contact bearing against one of two meeting faces of the semiconductive body and the base is on the other of the meeting faces and extends to the junction of these two faces. As will be described in detail hereinatfer, this construction facilitates the attainment of a sharp boundary at the edge of the base nearest the junction aforementioned. The emitter, then, may be positioned in immediate proximity to the junction whereby extremely close emitter-to-base spacings are attained. The collector, which also may be a point contact, may bear against the same face of the semiconductive body as the emitter or against the face opposite thereto.

The invention and the above-noted and other features thereof will be understood more clearly and fully from the following detailed description with reference to the accompanying drawing in which.

Figure 1:
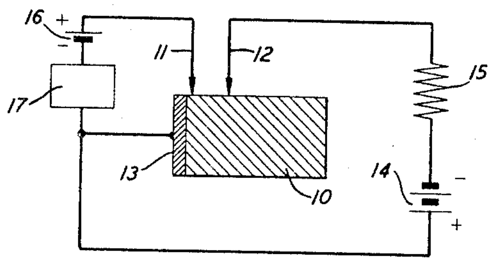
Fig. 1 is a diagram and schematic illustrating the principal elements and the association thereof in a semiconductor amplifier constructed in accordance with the invention.

In the drawing for the sake of clarity of illustration dimensions have been greatly exaggerated. The magnitude of the exaggeration will be appreciated from the following dimensions of a typical device of the construction illustrated in Figs. 1 to 6, inclusive. The semiconductive body may be of the order of .020 inch thick, .050 inch long and .050 inch wide, and the emitter and collector may be spaced of the order of .002 inch.

Referring now to the drawing, the amplifier illustrated in Fig. 1 comprises a body 10 of semiconductive material, for example of high-back voltage N-type germanium produced in the manner disclosed in the application Serial No. 638,351, filed December 29, 1945, of J. H. Scaff and H. C. Theuerer. Bearing against one face of the body 10, specifically the upper face in Fig. 1, are a pair of point contacts 11 and 12, for example of Phosphor bonze, which constitute the emitter and collector respectively. Upon one of the faces meeting the face mentioned is a large area substantially ohmic connection 13 constituting the base.

In operation of the device, the collector 12 is biased negative, of the order of 10 to 100 volts, relative to the base by a source 14. The load represented generally by the resistance 15, is included in the collector-to-base circuit. The emitter 11 is biased at a low potential, advantageously positive, of the order of a fraction of a volt with respect to the base 13. Signals are impressed between the emitter 11 and base 13 from a suitable signal source 17. It will be understood that the polarities of the source and particularly of the source 14 shown in Fig. 1 will be as described when the semiconductive body 10 is of N conductivity type. If the body is of P conductivity type, the polarities should be reversed from those shown in Fig. 1. For reasons given heretofore, the emitter 11 should be positioned as close as is practicable to the base 13.

Figure 2:
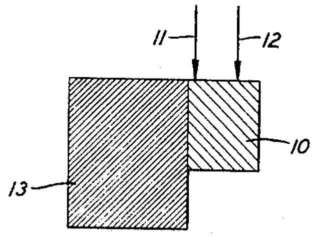
Fig. 2 is a diagram showing one manner in which the base connection to the body may be established.

One construction wherein this desideratum is achieved is illustrated in Fig. 2, the base connection 13 being in the form of a metal block to which the semiconductive body 10 is affixed. In the fabrication of the device illustrated in Fig. 2, the face of the semiconductive body 10 joined to the base 13 may be tinned and checkered and then soldered to the metallic block which may be for example of copper. The face of the body 10 against which the emitter and collector bear and the corresponding face of the metal 13 are ground or lapped whereby these two faces are accurately coplanar. Then the ground face of the body 10 is etched as in the manner described in the patent of J. A. Bardeen and W. H. Brattain heretofore identified. The emitter and collector 11 are brought to bear against the etched face, and held in position by suitable means, not shown.

It will be appreciated that this construction provides a very sharp edge on the base 13 at the junction of the two faces above-mentioned of the body 10 whereby a definite reference line is provided for positioning the emitter 11 relative to the base. The emitter 11 may be located in immediate proximity to the base by optical or mechanical methods.

Figure 3:
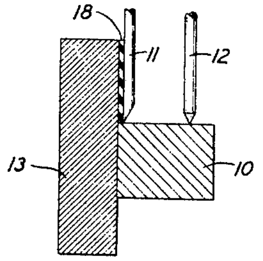
Fig. 3 is another diagram similar to Fig. 2 showing one way in which a prescribed emitter-to-base spacing may be realized in accordance with this inventon.

In the construction illustrated in Fig. 3, the body 10 is joined or affixed to the metallic base 11, for example, as in the manner described heretofore with reference to Fig. 2, and an insulating layer 18 of accurately prescribed thickness is provided upon one face of the base. This insulating member 18 may be, for example, a coating upon the base or a thin insulating film. The emitter 11 when brought to bear upon the semiconductive body 10 is positioned laterally by contact with the insulating member 18 whereby a preassigned spacing, determined by the thickness of this member, is obtained between the emitter and the base.

Figure 4:
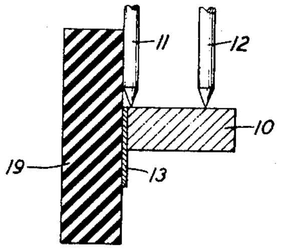
Fig. 4 is a diagram illustrating another embodiment of this invention wherein the base is in the form of a coating on one face of the body.

In the embodiment of this invention illustrated in Fig. 4, the base 13 is in the form of a thin metallic coating, for example of copper or rhodium, upon one face of the body 10 and is affixed to an insulating block 19. The block provides a reference surface, as is evident, for locating the emitter 11 laterally with respect to the base 13.

Alternatively, the insulating block 19 may have integral with it a metallic layer, such as nickel or molybdenum which would correspond to 13 in Fig. 4. The plated and tinned wafer is then soldered to the coating 13 so that the coating does not project above the upper face of the wafer, but does extend below the lower face, to provide access for a base connection.

Figure 5:
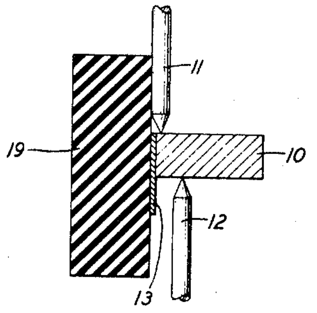
Fig. 5 illustrates still another embodiment of this invention in which the emitter and collector bear against opposite faces of the semiconductive body.

The embodiment of this invention illustrated in Fig. 5 is similar to that shown in Fig. 4 and described hereinabove. However, in the device of Fig. 5, the collector 12 bears against the face of the body 10 opposite that against which the emitter 11 bears. As shown, the collector is spaced a greater distance from the base 13 than is the emitter 11. In this construction, the body 10 may have a thickness measured in the direction between the emitter and the collector of the order of .005 inch.

In typical devices constructed in accordance with the invention, the emitter may have a diameter of the order of .002 inch so that in devices of the constructions illustrated, an emitter-to-base spacing of less than .001 inch is readily realized. In devices of the construction shown in Fig. 3, the insulating member may be of the order of 0.0001 inch thick whereby an emitter-to-base spacing of this magnitude is attained. Similar spacings may be realized in devices of the construction shown in Fig. 2.

It will be apparent that one feature of the constructions illustrated in Figs. 3, 4 and 5 is that an accurate reference surface for locating the emitter relative to the base is provided whereby the desired extremely small spacings may be achieved readily merely by moving the emitter against the insulating member 18, in Fig. 3 or the insulating block 19 in Figs. 4 and 5. Thus, the small spacings which lead to very low values of the positive feedback impedance are attainable expeditiously.

Figure 6:
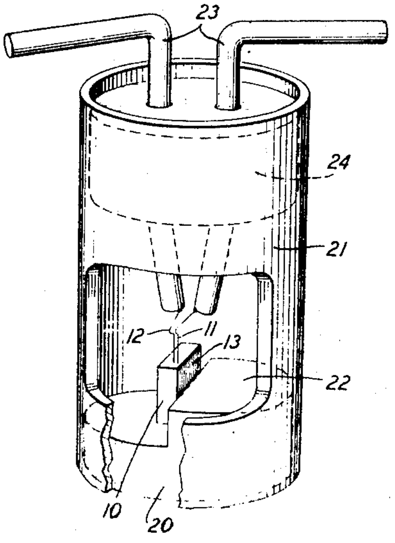
Fig. 6 is a perspective view of a translating device illustrative of one embodiment of this invention.

In the embodiment of the invention illustrated in Fig. 6, the semiconductive body 10 has the base coating 13 thereon affixed, as by soldering, to a metallic block 20 in turn secured to a metallic housing 21 having an aperture or window 22 therein. The emitter and collector 11 and 12, in the form of generally C-shaped pointed wires are mounted by metallic studs 23 embedded in an insulating plug 24 secured to the housing 21. The emitter point is positioned in immediate proximity to the base, as by bending the emitter wire, its position being observable optically through the window 22.

Although specific embodiments of this invention have been shown and described, it will be understood that they are but illustrative and that various modifications may be made therein without departing from the scope and spirit of the invention.

What is claimed is:

1. A signal translating device comprising a body of semiconductive material having two meeting surfaces, a base connection on one of said surfaces and extending from the junction of said two surfaces, an emitter connection to the other of said surfaces in immediate proximity to said junction, and a collector connection to said body relatively remote from said junction.

2. A signal translating device comprising a body of germanium having two plane meeting surfaces, a base connection on one of said surfaces and extending from the junction of said two surfaces, a point contact emitter bearing against the other of said surfaces in immediate proximity to said junction, and a collector connection to said body relatively remote from said junction.

3. A signal translating device comprising a metallic base, a body of semiconductive material abutting said base, one face of said base and one face of said body meeting and being coplanar, an emitter connection to said face of said body in immediate proximity to the junction of said coplanar faces, and a collector connection to said body relatively remote from said junction.

4. A signal translating device comprising a metallic base, a body of germanium having one face abutting a face of said base, said body and base having meeting substantially coplanar faces extending substantially normal to said one face, a point contact emitter bearing against the coplanar face of said body in immediate proximity to the junction of said meeting faces, and a collector connection to said body relatively remote from said junction.

5. A signal translating device comprising a semiconductive body having two meeting surfaces, a metallic base joined to one of said surfaces and projecting beyond the junction of said surfaces, an insulating member abutting said base in proximity to said junction, an emitter connection to the other of said surfaces and located relative and in proximity to said junction by said insulating member, and a collector connection to said body relatively remote from said junction.

6. A signal translating device comprising a metallic base and a semiconductive body having opposed joined faces, the face of said base projecting beyond the face of said body, an insulating layer on the projecting face portion of said base, said body having a second face extending from said projecting face and substantially normal thereto, a point contact emitter bearing against said second face and laterally abutting said insulating layer, and a collector connection to said body, the emitter to base spacing being small relative to the base to collector connection spacing.

7. A signal translating device comprising a block of insulating material, a body of semiconductive material having two meeting faces, a metallic coating on one of the said faces and extending from the junction of said meeting faces, said coating being in face-to-face relation with and bearing against one face of said block, an emitter connection to the other of said meeting faces and laterally abutting said one face of said block, and a collector connection to said body and spaced from said coating a distance substantially greater than the spacing between said emitter connection and said coatings.

8. A signal translating device comprising an insulating block having a plane face, a body of germanium having two surfaces meeting at substantially 90 degrees, a metallic coating on one of said meeting surfaces and extending from the junction of said meeting surfaces, said coating being in face-to-face relation and bearing against said plane face, a point contact emitter bearing against the other of said meeting faces and laterally abutting said plane face, and a collector connection to said body relatively remote from said coating.

WILLIAM G. PFANN.

No references cited.